United States Patent
Ausschnitt et al.

(10) Patent No.: US 7,473,502 B1
(45) Date of Patent: Jan. 6, 2009

(54) IMAGING TOOL CALIBRATION ARTIFACT AND METHOD

(75) Inventors: Chistopher P. Ausschnitt, Lexington, MA (US); Lewis A. Binns, York (GB); Jennifer L. Morningstar, Hyde Park, NY (US); Nigel Smith, Hsinchu (TW)

(73) Assignees: International Business Machines Corporation, Armonk, NY (US); Nanometrics Incorporated, Milpitas, CA (US)

( * ) Notice: Subject to any disclaimer, the term of this patent is extended or adjusted under 35 U.S.C. 154(b) by 0 days.

(21) Appl. No.: 11/833,304

(22) Filed: Aug. 3, 2007

(51) Int. Cl.
*G03F 9/00* (2006.01)
*G03C 5/00* (2006.01)

(52) U.S. Cl. .......................... 430/22; 430/30
(58) Field of Classification Search .................. 430/22, 430/30
See application file for complete search history.

(56) References Cited

U.S. PATENT DOCUMENTS

| | | | |
|---|---|---|---|
| 5,300,786 | A | 4/1994 | Brunner et al. |
| 6,612,159 | B1 | 9/2003 | Knutrud |
| 6,869,739 | B1 | 3/2005 | Ausschnitt et al. |
| 6,879,400 | B2 | 4/2005 | Ausschnitt et al. |
| 6,937,337 | B2 | 8/2005 | Ausschnitt et al. |
| 6,975,398 | B2 | 12/2005 | Ausschnitt et al. |
| 7,042,551 | B2 | 5/2006 | Ausschnitt |
| 2001/0001900 | A1 | 5/2001 | Pogge et al. |
| 2002/0097399 | A1 | 7/2002 | Ausschnitt et al. |
| 2003/0053057 | A1 | 3/2003 | Mishima |
| 2007/0058169 | A1 | 3/2007 | Asusschnitt et al. |

FOREIGN PATENT DOCUMENTS

| | | |
|---|---|---|
| JP | 61-168227 | 7/1986 |
| JP | 61-170032 | 7/1986 |
| JP | 2-260441 | 10/1990 |
| JP | 10-213895 | 8/1998 |
| WO | WO02/19415 | 3/2002 |

OTHER PUBLICATIONS

Starikov, Alexander; "Exposure Monitor Structure" Integrated Circuit Metrology, Inspection and Process Control IV, 1990, pp. 315-324.
"Method for Measuring Semiconductor Lithographic Tool Focus and Exposure", IBM Technical Disclosure Bulletin, Jul. 1987, 2 pages.
Ausschnitt, Christopher P., Cheng, Shaunee Y.; "Modeling for Profile-Based Process- Window Metrology", SPIE5378-5, Feb. 26, 2004, pp. 1-6.
Binns, L.A. et al., Nanometrics; Ausschnitt, C.P., et al. IBM SDRC; "Overlay Metrology Tool Calibration", Proc. SPIE 6518 (2007), 8 pages.
Raugh, Michael R., "Self-calibration of Interferometer Stages: Mathematical Techniques for Deriving Lattice Algorithms for Nanotechnology"; Mar. 2002 (rev. Aug. 2003), 66 pages.

*Primary Examiner*—Christopher G Young
(74) *Attorney, Agent, or Firm*—DeLio & Peterson, LLC; Peter W. Peterson; Wenjie Li

(57) ABSTRACT

A method of determining and correcting for distortions introduced by an imaging tool. The method includes providing an imaging tool having a field of view (FOV), and creating a target pattern containing a regular array of symmetric sub-patterns having locations spanning the FOV. Using the imaging tool, the method then includes measuring relative position of the sub-pattern images at one or more target orientations, determining tool-induced sub-pattern position deviations from designed locations of the sub-patterns, and applying corrections to compensate for an orientation independent component of the sub-pattern position deviations. The target pattern may be mounted on a stage of the measurement tool, created on a mask used in the lithographic process, or created on a wafer being measured by the measuring tool.

20 Claims, 9 Drawing Sheets

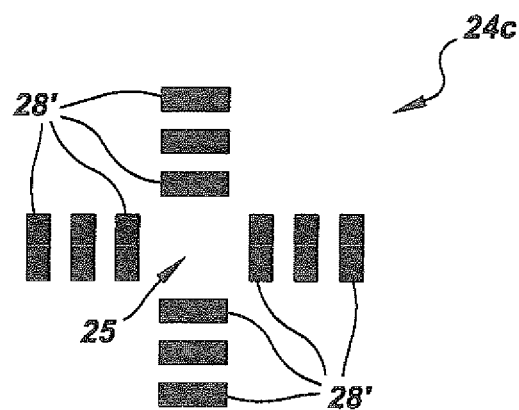
FIG.9
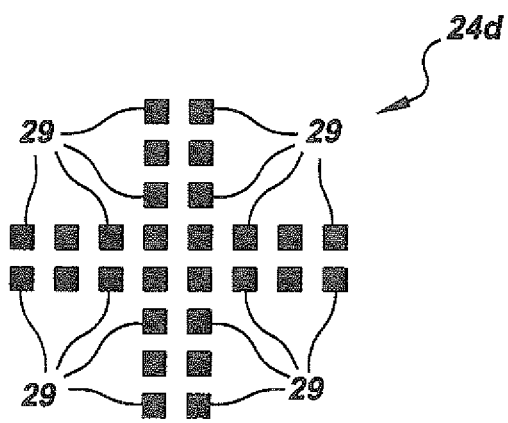
FIG.10
FIG.11
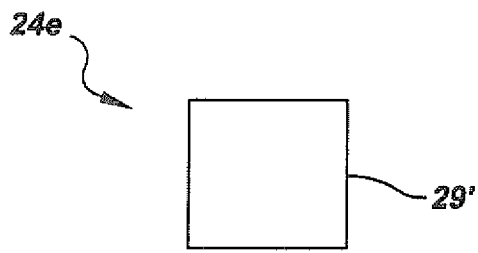
FIG.12
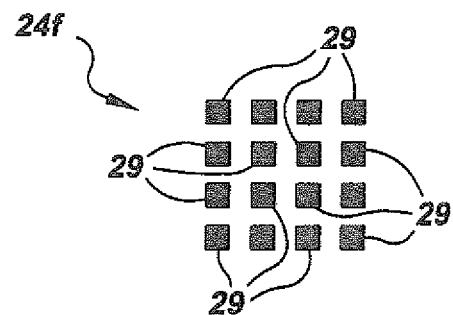

IMAGING TOOL CALIBRATION ARTIFACT AND METHOD

BACKGROUND OF THE INVENTION

1. Field of the Invention

The present invention relates to the manufacture of integrated circuits and, in particular, to a method and system for determining systemic distortions of an overlay error measurement introduced by the imaging system and measurement tool used in lithographic processing of integrated circuits.

2. Description of Related Art

Semiconductor manufacturing requires the sequential patterning of process layers on a single semiconductor wafer. Exposure tools known as steppers or scanners print multiple integrated circuit patterns or fields by lithographic methods on successive layers of the wafer. These exposure tools typically pattern different layers by applying step and repeat lithographic exposure or step and scan lithographic exposure in which the full area of the wafer is patterned by sequential exposure of the stepper fields containing one or more integrated circuits. Typically, 20-50 layers are required to create an integrated circuit. In some cases, multiple masks are required to pattern a single layer.

Associated with the control semiconductor manufacturing is pattern measurement on most, if not all, of the process layers. Measurements are typically performed using "imaging" metrology tools. In the metrology context "imaging" is defined as the creation of a microscopic representation of the actual pattern on the wafer in one or more dimensions over a field of view (FOV) characteristic of the metrology tool. Typically, imaging metrology tools are optical, scanning e-beam or atomic force microscopy systems. In particular, optical microscopy tools usually provide two-dimensional (2-D) images of the patterned substrate over a circular or square FOV. Measurements are performed on images captured by the imaging tools. These measurements are usually classified as CD (critical dimension), the distance between any pair of pattern edges within the FOV, or overlay, the distance between the centroids of any pair of patterns within the FOV.

Metrology accuracy is limited by the within-FOV fidelity of the imaging system. Imaging system calibration and matching methods must distinguish between actual within-FOV pattern variation and systematic distortions introduced by the imaging system. There is a need to determine this latter factor, i.e., systemic distortions of an overlay measurement method introduced by the measurement tool used in the lithographic process. Accurate calibration is critically important in lithographic processing of integrated circuits to meet design requirements, and it would be extremely useful to be able to self-calibrate a metrology tool. "Calibration" minimizes the systematic distortions introduced by each imaging system, whereas "matching" minimizes the distribution of systematic distortions among a set of imaging systems. The purpose of self-calibration is to derive improved Cartesian coordinates for both the location of grid points on an artifact used for the target and for the coordinate system on the measuring plane of the instrument where the grid points are measured. Such self-calibration may be used to determine and correct for the distortions introduced by an imaging tool.

Prior art calibration artifacts and methods have several drawbacks. Conventional imaging system artifact structures generally have low information content and poor FOV sampling. Isolated CD patterns, with known, externally calibrated, feature geometry sample only a small subset of the FOV. Box-in-box (BiB) or one dimensional (1-D) grating overlay patterns cannot determine the tangential component of distortion. Additionally, external calibration of feature geometries is a laborious task. Prior art features that are designed to sample specific imperfections in the objective, e.g., arrangements of blazed grating structures, typically provide information that does not translate simply into in-line CD or overlay measurement performance. Accordingly, there is a need for an improved artifact and method for the comprehensive across-FOV calibration and matching of imaging systems.

U.S. Patent Application 2007/0058169, the disclosure of which is hereby incorporated by reference, discloses an improved method and target system for determining overlay or alignment error between different fields in the same lithographic level or among the many lithographic levels required to create an integrated circuit. The multi-layer overlay target disclosed therein achieves comparable or superior metrology performance to box-in-box or grating structures, at substantial reduction of metrology target real estate. This method and target has been shown to meet the requirements on current design rules, while giving some unique benefits. However, as future design rules shrink, there is a need to improve on that technology.

SUMMARY OF THE INVENTION

Bearing in mind the problems and deficiencies of the prior art, it is therefore an object of the present invention to provide an improved artifact and method for a comprehensive, across-field of view calibration and matching of imaging systems.

It is another object of the present invention to provide an improved method of determining and correcting for the distortions introduced by an image-based measurement tool and a nano-scale lithographic manufacturing process.

A further object of the invention is to provide an improved method and system for determining systemic distortions of an overlay error measurement introduced by the imaging system and measurement tool used in lithographic processing of integrated circuits.

It is yet another object of the present invention to provide an artifact and method of using the artifact to achieve the above objects, wherein the artifact provides a calibration target of small size that may be printed in the scribe or kerf areas of semiconductor wafers.

It is a further object of the present invention to provide an artifact and method of using the artifact to achieve the above objects, wherein the artifact provides large numbers of calibration targets that may be measured at low cost.

Still other objects and advantages of the invention will in part be obvious and will in part be apparent from the specification.

The above and other objects, which will be apparent to those skilled in the art, are achieved in the present invention which is directed to a method of determining and correcting for distortions introduced by an imaging tool comprising providing an imaging tool having a field of view (FOV), and creating a target pattern containing a regular array of symmetric sub-patterns having locations spanning the FOV. Using the imaging tool, the method then includes measuring relative position of the sub-pattern images at one or more target orientations, determining tool-induced sub-pattern position deviations from designed locations of the sub-patterns, and applying corrections to compensate for an orientation independent component of the sub-pattern position deviations.

The target pattern may be mounted on a stage of the measurement tool, created on a mask used in the lithographic process, or created on a wafer being measured by the measuring tool.

In one preferred embodiment, the on-product overlay measurement marks are intended to be created on more than one lithographic layer, and the target pattern is created on a single lithographic layer.

In another aspect, the present invention is directed to a method of determining and correcting for distortions introduced by an image-based overlay measurement tool in a lithographic process comprising providing an image-based overlay measurement tool having a field of view (FOV), determining locations of overlay measurement marks on a product to be measured by the measurement tool, and creating a target pattern containing a regular array of symmetric sub-patterns whose locations in the FOV match those of the on-product overlay measurement marks. Using the measurement tool, the method includes measuring relative position of the sub-pattern images, determining tool-induced sub-pattern position deviations from designed locations of the sub-patterns, and applying corrections to overlay measurements that use corresponding sub-pattern locations within the FOV to compensate for an orientation independent component of the tool-induced sub-pattern position deviations.

In a further aspect, the present invention provides a method of determining and correcting for distortions introduced by an image-based overlay measurement tool in a lithographic process comprising providing an image-based overlay measurement tool having a field of view (FOV), determining locations of overlay measurement marks on a product to be measured by the measurement tool, and creating a target pattern containing a regular array of symmetric sub-patterns whose locations in the field of view match those of the on-product overlay measurement marks. The method then includes determining positions of the sub-patterns by an external measurement tool or technique and, using the measurement tool, measuring relative position of the sub-pattern images. The method further includes determining tool-induced sub-pattern position errors relative to the externally determined positions and applying corrections to overlay measurements that use the corresponding sub-pattern locations within the FOV to compensate for an orientation independent component of the tool-induced sub-pattern position errors.

Yet another aspect of the present invention provides a method of determining and correcting for the distortions introduced by an image-based measurement tool and a nano-scale lithographic manufacturing process comprising creating a reference grid containing positions of a regular array of symmetric sub-patterns for an ideal target, lithographically forming a product target on a substrate, the product target having a regular array of symmetric sub-patterns corresponding to the positions of the regular array of symmetric sub-patterns on the reference grid, and capturing images of the regular array of symmetric sub-patterns of the product target on the wafer. The method then includes measuring deviation of positions of the product target sub-pattern images relative to the corresponding sub-patterns on the reference grid, at one or more target orientations, and separately determining orientation dependent and independent components of the measured deviations from the corresponding sub-patterns on the reference grid. The method further includes applying corrections to measurements at corresponding on-grid and off-grid sub-pattern image locations to compensate for tool-induced sub-pattern placement errors, and monitoring and controlling the distribution of process-induced sub-pattern placement errors over the wafer.

Preferably, the method further includes measuring deviation of positions of the product target sub-pattern images relative to the corresponding sub-patterns on the reference grid, at multiple target orientations, and separately determining the orientation dependent and independent components of the measured deviations from the corresponding sub-patterns on the reference grid based on the measured deviations at the multiple target orientations.

A further aspect of the present invention provides a method of calibrating and matching image-based metrology systems used for micro- and nano-scale lithographic manufacturing processes comprising creating a reference grid containing positions of a regular array of symmetric sub-patterns for an ideal target, and lithographically forming a calibration target on a substrate at two or more orientations with respect to field of view of an image-based metrology system, the calibration target having a regular array of symmetric sub-patterns corresponding to the positions of the regular array of symmetric sub-patterns on the reference grid. Using the image-based metrology system, the method includes capturing images of the regular array of symmetric sub-patterns of the calibration target on the wafer for at least two orientations of the calibration target, determining centers of the sub-pattern images of the calibration target, and measuring deviation of positions of the calibration target sub-pattern images relative to the corresponding sub-patterns on the reference grid, for at least two orientations of the calibration target. The method further includes determining orientation independent components of the measured deviations from the corresponding sub-patterns on the reference grid, and applying adjustments available on the metrology system to minimize linear alignment and image contributions to the orientation independent components of the measured deviations. After applying the adjustments, the method includes determining any residual deviations of the calibration target sub-pattern images from the corresponding sub-patterns on the reference grid, and applying corrections to grid locations of subsequent images captured by the metrology system.

The target may be formed on a wafer to be manufactured by the lithographic manufacturing process, or on a stage of the image-based measurement tool.

Preferably, after applying the corrections, the method includes interpolating further deviation of positions of the calibration target sub-pattern images, relative to a pitch grid finer than the reference grid, among neighboring grid locations to determine deviations from the finer pitch grid.

The method may further include translating captured images of the calibration target sub-pattern images by an integer fraction of the pitch to achieve measurements on a relative to a pitch grid finer than the reference grid, and repeating the steps of measuring deviation of positions of the calibration target sub-pattern images and determining orientation dependent and independent components of the measured deviations, prior to applying the corrections to the measurements at corresponding on-grid and off-grid locations.

Another aspect of the invention is directed to a method of simultaneously calibrating and matching image-based metrology systems and monitoring and optimizing micro- and nano-scale lithographic manufacturing processes comprising creating a reference grid containing positions of a regular array of symmetric sub-patterns for an ideal target, and lithographically forming a calibration target on a mask to be used in a lithographic manufacturing process, at two or more orientations with respect to field of view of an image-based metrology system, the calibration target having a regular array of symmetric sub-patterns corresponding to the positions of the regular array of symmetric sub-patterns on the reference grid. Using the lithographic manufacturing process mask, the method includes printing the calibration target at the two or more orientations along with an image of a functional device on a wafer substrate. Then, using an image-based metrology system, the method includes capturing images of the regular array of symmetric sub-patterns of the calibration target on the wafer for at least two orientations of the calibration target, determining centers of the sub-pattern images of the calibration target, and measuring deviation of positions of the calibration target sub-pattern images relative to the corresponding sub-patterns on the reference grid, for at least two orientations of the calibration target. The method then includes determining orientation dependent and independent components of the measured deviations from the corresponding sub-patterns on the reference grid, storing the orientation dependent and independent components of the measured deviations, and applying corrections to grid locations of subsequent images captured by the metrology system.

Preferably, after applying the corrections, the method includes interpolating further deviation of positions of the calibration target sub-pattern images, relative to a pitch grid finer than the reference grid, among neighboring grid locations to determine deviations from the finer pitch grid.

The method preferably further includes translating captured images of the calibration target sub-pattern images by an integer fraction of the pitch to achieve measurements on a relative to a pitch grid finer than the reference grid, and repeating the steps of measuring deviation of positions of the calibration target sub-pattern images and determining orientation dependent and independent components of the measured deviations, prior to applying the corrections to the measurements at corresponding on-grid and off-grid locations.

The calibration target pattern used in the aforementioned methods preferably contains at least two different patterns, a first target pattern having a center at the origin of an orthogonal grid of pitch p. The sub-patterns of the first target pattern have coordinates of:

$(-M,N)p, (N,M)p, (M,-N)p$ and $(-N,-M)p$, where N and M are integers, and the distance r of each first target sub-pattern from the center of the first target pattern is defined by the equation:

$r = p\sqrt{(N^2+M^2)}$.

A second target pattern has a center at the same location as the first target pattern, with the sub-patterns of a second target pattern have coordinates of:

$(-M+m,N+n)p, (N+n,M+m)p, (M+m,-N+n)p$ and $(-N+n,-M+m)p$, where n and m are integers, and $|n|+|m|=2i$, where i is an integer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 6-12 show alternate embodiments of marks or sub-patterns that may be used in the present invention.

DESCRIPTION OF THE PREFERRED EMBODIMENT(S)

Figure 1:
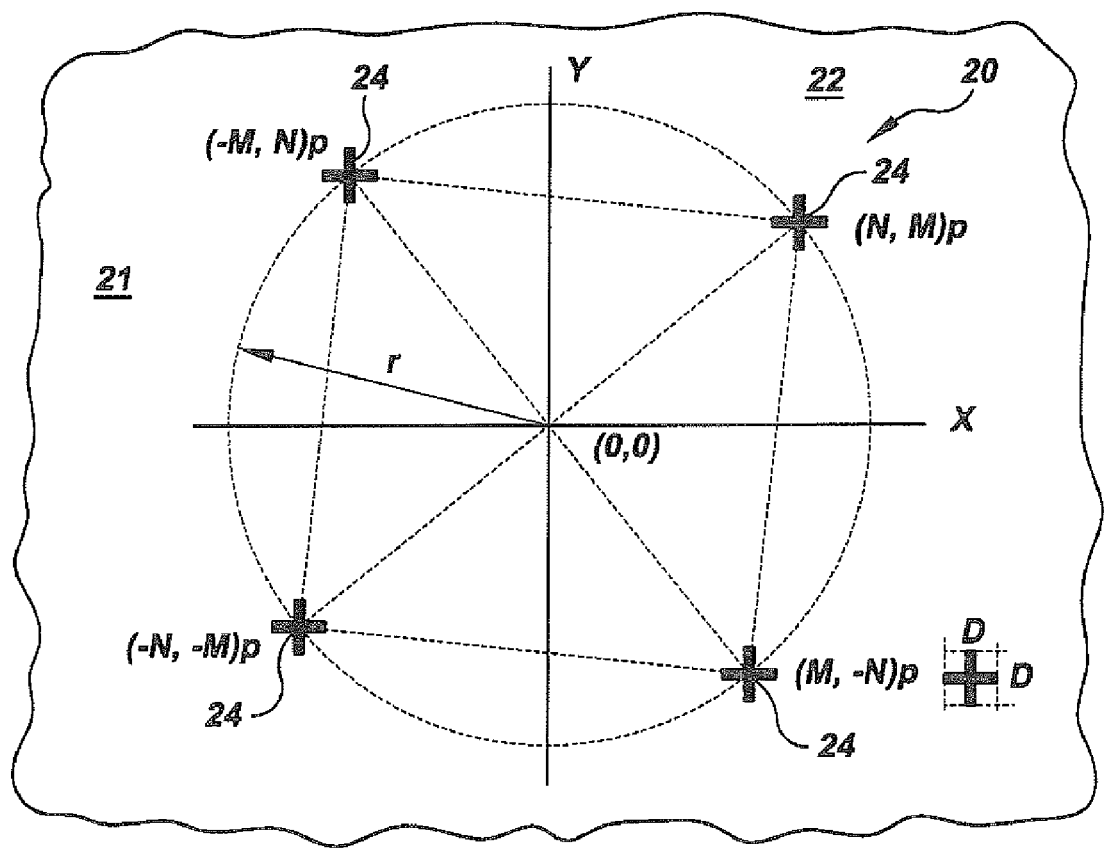
FIG. 1 is a top plan view of the layout of one embodiment of a group of marks or sub-patterns for a target pattern or artifact, formed on a single lithographic layer.

In describing the preferred embodiment of the present invention, reference will be made herein to FIGS. 1-16 of the drawings in which like numerals refer to like features of the invention.

In deconvolving metrology error sources, one must look at both actual error and tool error. Actual error, $(\Delta X, \Delta Y)_A$, refers to placement errors introduced by pattern fabrication. These errors are dependent on the orientation of the imaging system with respect to the substrate pattern. Systematic and random errors may be introduced by fabrication tools, for example, in stage synchronization, lens aberrations, and the like. These can include printing defects, stitching errors, mark asymmetry, and the like. Systematic and random errors may also be introduced by the non-uniformity of fabrication processes such as coating, baking, developing, etching, and the like. These can include process defects, line-edge roughness, coat/bake/develop/etch non-uniformity, and the like.

Tool Error $(\Delta X, \Delta Y)_T$, refers to placement errors introduced by the imaging of the fabricated pattern. These errors are independent of the orientation of the imaging system with respect to the substrate pattern, and include tool-induced-shift and substrate/wafer-induced-shift. Tool-induced-shift (TIS) refers to measurable errors introduced by the imaging system, such as aberrations, illumination non-uniformity, dirt, and the like, and by the detector, such as pixel placement, sensitivity, and the like. TIS is characterized by the mean and variability (standard deviation) of the tool error under fixed process conditions; i.e. $TISM=Mean(\Delta X, \Delta Y)_T$ and $TISV=Stdev(\Delta X, \Delta Y)_T$.

Being able to distinguish the metrology tool errors from the artifact errors is essential to calibration and matching. That is, for metrology calibration and matching, one can only correct the TIS error. To achieve calibration and matching, one must subtract out the TIS at each measurement location. Furthermore, the TIS signature across the FOV under representative process (e.g., semiconductor manufacturing layers) and imaging tool setting (e.g., focus, illumination, etc.) conditions, is a comprehensive measure of the intrinsic calibration and matching capability among a set of imaging tools.

In the present invention, a single-layer artifact is used for the calibration and matching of image-based metrology systems and the process monitoring and control of micro- and nano-scale device manufacturing consisting of an array of symmetric marks on a Cartesian (square) grid. The grid preferably has center-to-center mark spacing, i.e., pitch, that is greater than the minimum resolvable pitch, much greater than the imaging system pixel pitch at the image magnification, and much less than the minimum FOV dimension of the imaging system. The grid also includes a number of marks that is sufficient to sample a square of dimension greater than or approximately equal to the maximum dimension of the imaging system FOV. More preferably, the grid locations correspond to the target locations used to monitor and control the manufacturing process, and at least one artifact mark is replaced by a unique, preferably asymmetric, pattern recognition feature. Also, a rotatable artifact replica may be mounted on the stage of the imaging system, which is preferred for individual system calibration. The artifact may be replicated on the masks and substrates used in the manufacturing process, which is preferred for system matching, process monitoring and optimization.

The preferred target or artifact of the present invention places a plurality of sub-patterns at a constant radial distance about a common center, such that the sub-patterns are symmetric about a target pattern center and preferably define the corners of a geometric shape, more preferably a square. Other geometric shapes may also be used, with the sub-patterns located at the corners of the shapes. The sub-patterns can be any feature or combination of features that is symmetric about the x-y axes, such as a cross, circle, square, square grid, and the like. The cross is the simplest among the sub-pattern options.

As shown in FIG. 1, one embodiment of a target pattern or mark group 20 in accordance with the present invention is shown on a single lithographic layer 22 formed on a wafer 21. In an actual wafer production, lithographic level 22 contains an integrated circuit field (not shown) also lithographically formed, and target pattern 20 is preferably located in an inactive area of the wafer either within the chip boundary or in the kerf region. Mark group 20 forms a square superimposed over a regular orthogonal grid of pitch p. Sub-patterns 24 comprise crosses located at the corners of the square whose center is at the origin (0,0) of the x- and y-axes. The length of the line segments making up the sub-pattern crosses is shown as dimension D. The x-y location of each sub-pattern from the center (0,0) of the square are integer multiples (N,M) of p. The centers of the sub-patterns are located at a distance, radius r, from the center of the mark group:

$$r = p\sqrt{(N^2 + M^2)}$$

The artifact or calibration target pattern of the present invention includes other lithographically formed mark groups in addition to the first mark group of FIG. 1. As the additional mark groups are created on the same lithographic layer containing the other portions of the integrated circuit, the (N,M) values are incremented by integers (n,m). Each mark group corresponds to unique values of (N,M). Radial symmetry of the target is maintained at each mark group. The radii of the sub-patterns may be the same or different for each mark group and the centers of the sub-patterns of mark group define a unique radius for the target. Under the constraint that the sum of the absolute values of the increments are even, i.e, $|n|+|m|=2i$ for integer i, superposition of the sub-patterns over multiple mark groups defines an overlay target in the form of a close-packed diagonal array.

Figure 2:
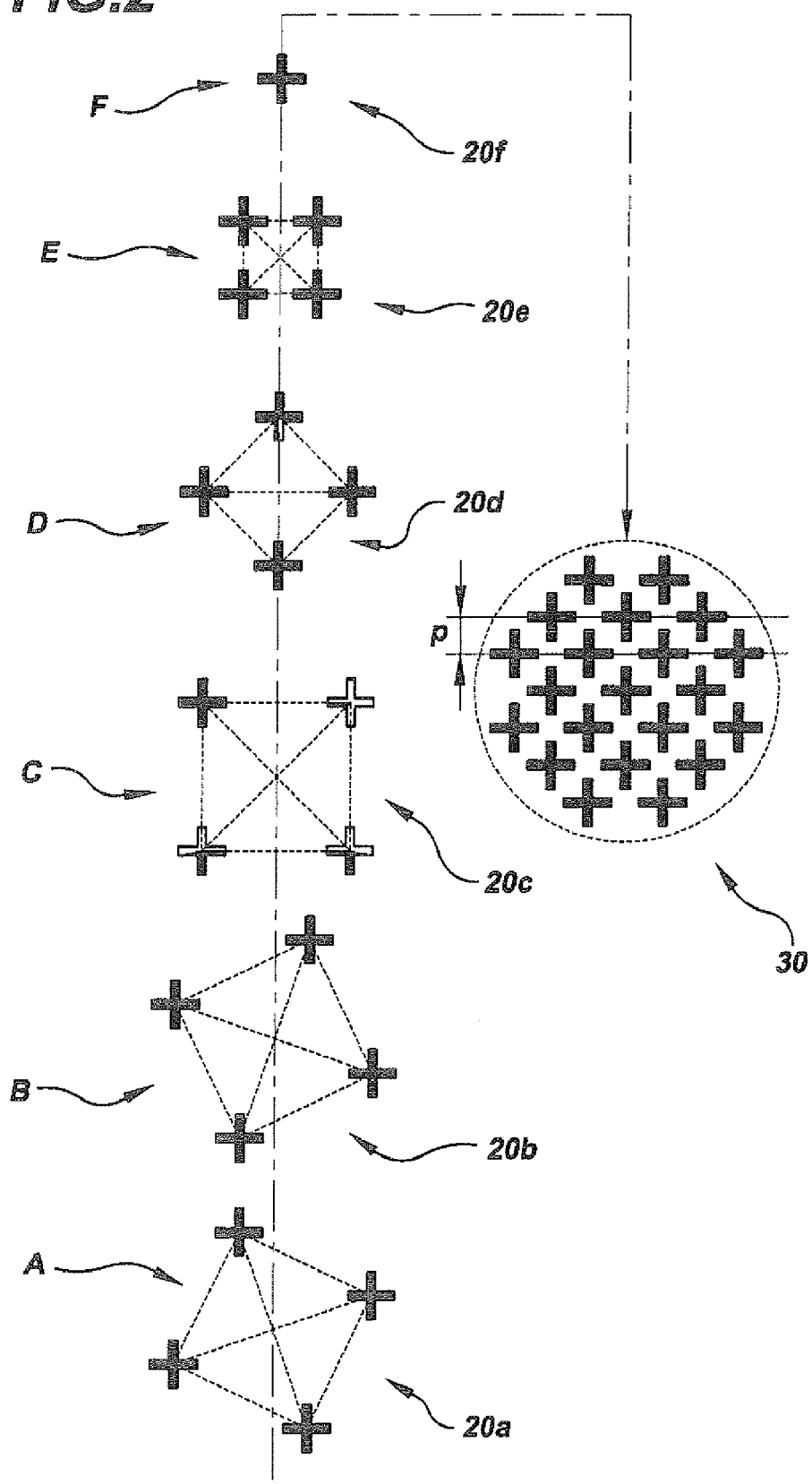
FIG. 2 is a top plan view of the layout of multiple mark groups A through F of the type shown in FIG. 1 for a target pattern or artifact, to be formed on a single lithographic layer.

As shown in FIG. 2, target patterns 20a, 20b, 20c, 20d, 20e and 20f are identified as mark groups A, B, C, D, E and F, respectively, each formed on the same lithographic layer. The targets of mark groups A through E are formed in a square pattern as described above; the target of mark group F is a single sub-pattern cross at the center of the overlaid array of targets. The individual targets 20a, 20b, 20c, 20d, 20e and 20f are located on the same layer so that they would all have the same center location if the mark groups were perfectly aligned. Each of the target patterns 20a, 20b, 20c, 20d, and 20e is incremented from the one preceding it in the manner described above. After the successive mark groups are lithographically formed, the target patterns or mark groups are overlaid on one another as shown by combined target pattern array 30. The cross sub-patterns do not overlap in the array provided the cross dimension D<2p.

For a square FOV of dimension $S_{FOV}$, the number of sub patterns in checkerboard, C, may be determined by the equation:

$$C = (S_{FOV}/P)((S_{FOV}/2p) - 1))$$

The preferred artifact design criteria is:

$$p_{pixel} < p_{min} < p << S_{FOV}$$

where:

$p_{pixel}$=Detector pixel size at the metrology magnification, and $p_{min}$=Minimum resolvable image pitch.

Figure 3:
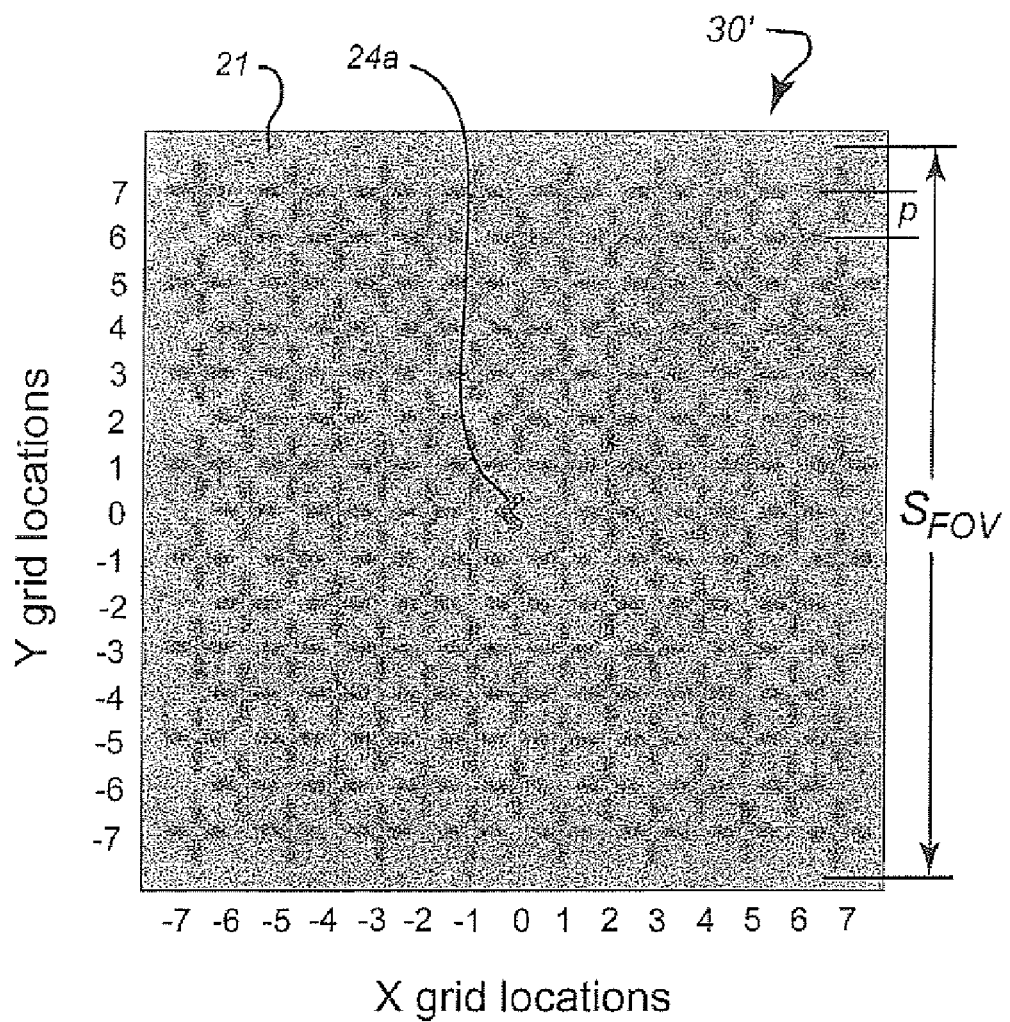
FIG. 3 is a top plan view of overlapped mark groups of the type shown in FIG. 2 on 28 formed on a single lithographic layer.

An embodiment of a fully populated overlay target array artifact as printed on a wafer substrate 21 is shown in FIG. 3, with the X-grid and Y-grid locations depicted on the axes. Artifact 30' has a square configuration, with a side dimension $S_{FOV}$ identified, and the pitch p of the individual marks shown. Artifact 30' is designed to fit within a FOV of desired size. A chevron-shape sub-pattern 24a with arms at an angle α of 45° marks the center of target array 30' to provide a pattern recognition mark distinguishable from the surrounding sub-pattern crosses. For an embodiment of the artifact for use in an optical system, the dimensions may be as follows:

$S_{FOV}$=50 μm
$p_{pixel}$~0.1 μm
$p_{min}$~0.5 μm
p=3.0 μm
C=112

For an embodiment of the artifact for use in a scanning electron microscope (SEM) system, the dimensions may be as follows:

$S_{FOV}$=5 μm
$p_{pixel}$~0.00 μm
$p_{min}$~0.01 μm
p=0.3 μm
C=112

Figure 4:
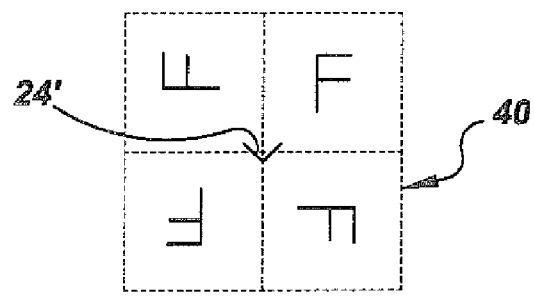
FIG. 4 is a top plan view showing the rotation of a target pattern or artifact in one quadrant by increments of 90 degrees.

The artifact of the type shown in FIG. 3 is a high density 2-D array of within-FOV symmetric marks, i.e., crosses, on a Cartesian grid. With the exception of the pattern recognition chevron, the target of FIG. 3 is invariant to rotation in increments of 90 degrees. This facilitates both the target design and target placement around the perimeter of the circuit. Preferably, artifact has four quadrants, each rotated from the other in increments of 90 degrees, as shown in FIG. 4, where the letter F represents the orientation of quadrant of target group 40. The target design requires layout of only one quadrant of the target. The marks have radial symmetry by quadrant, such that at least four marks are preferably located at each radial distance from the artifact center, at least one mark per quadrant is preferably located at each radial distance, and common-radius marks are preferably specified by integer multiples N, M of the grid pitch p. The centrally located asymmetric mark, i.e., chevron 24, is provided for pattern recognition and artifact orientation.

Figure 5:
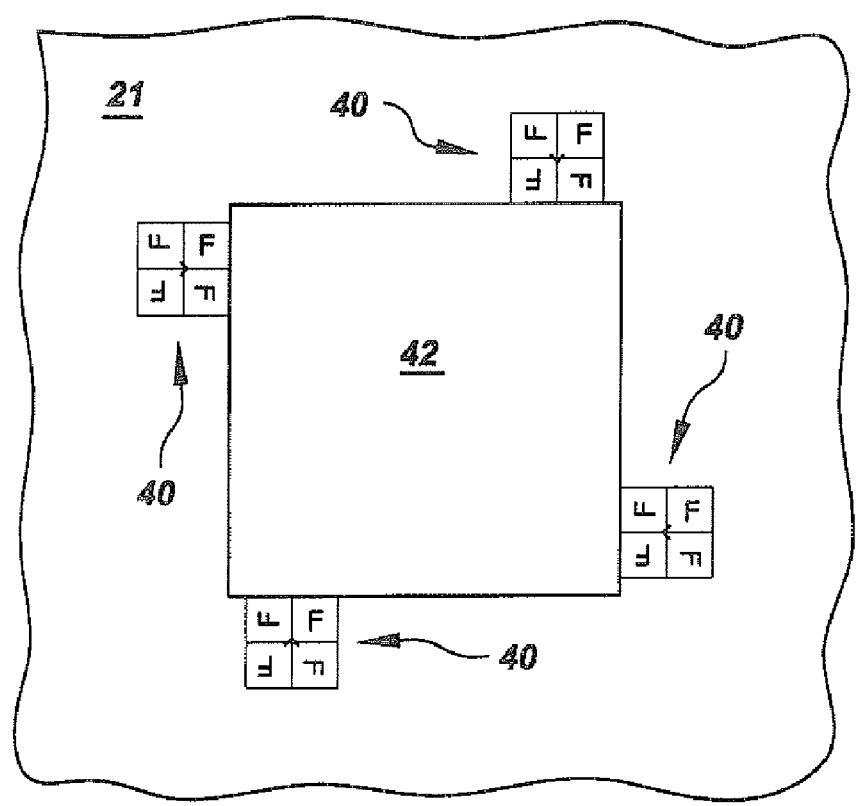
FIG. 5 is a top plan view of showing a group of targets rotated in increments of 90 degrees on all four sides of a rectangular circuit.

Furthermore, a group of targets 40 representing the entire set of possible mark groups can be designed in one orientation to fit within the kerf on one side of the rectangular circuit area 42 on a layer of wafer 21, and rotated in increments of 90 degrees for placement on the other three sides of the circuit, as shown in FIG. 5. The artifacts or targets 40 are created on a lithographic mask and printed simultaneously with the functional circuit 42 on the wafer substrate using otherwise standard lithographic manufacturing techniques. The pattern recognition chevron in the center of each of the target groups then serves as an arrow pointing to the circuit, thus providing a useful indicator during overlay recipe build.

Central pattern recognition enables the most robust image capture and centering by otherwise conventional optical pattern recognition software. Using optical pattern recognition software, one would first center and capture the image of the overlaid target array. From that image, one would then determine sub-pattern (cross) centers using conventional threshold or correlation algorithms operating on the images of each sub-pattern. Using the sub-pattern centers, one would then determine, based on the known layout and layer identification (maintained in a database that is accessible at the time of measurement), which sub-patterns define each target pattern on a lithographic field, and then determine the target pattern shape (square) centers for each lithographic field. Using the center locations for each target pattern on each field, one would then determine pair-wise differences among shape (square) centers, i.e., overlay error, between each adjacent field. The center locations of the sub-patterns that define the apices of the target shape also enable determination of the deviation of each shape from its nominal dimensions. This serves as a useful metrology and process diagnostic.

Figure 6:
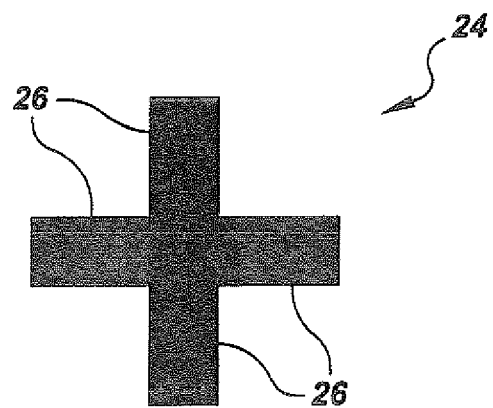
Figure 7:
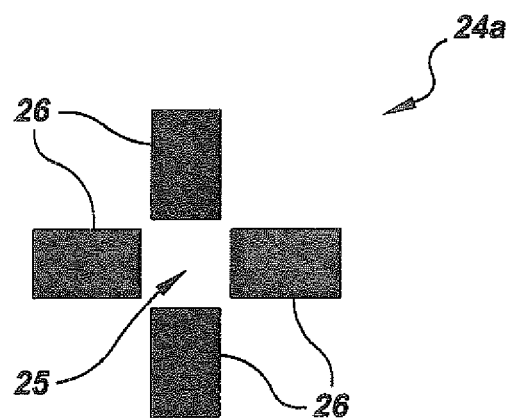
Figure 8:
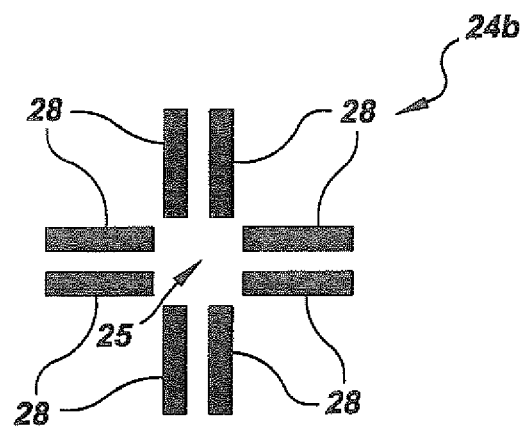

Preferred sub-pattern or mark embodiments are shown in FIGS. 6-11. In FIG. 6, the sub-pattern mark 24 consists of intersecting solid arms 26 while in FIG. 7, the sub-pattern mark 24a consists of solid arms 26 extending away from an open center 25. The sub-pattern marks may also be comprised of smaller, ground-rule compatible elements as illustrated by spaced lines 28 parallel to the arm direction and forming the cross arms of sub-pattern 24b in FIG. 8, spaced lines 28' perpendicular to the arm direction and forming the cross arms of sub-pattern 24c in FIG. 9, and spaced contacts or posts 29 forming the cross arms of sub-pattern 24d in FIG. 10. The sub-patterns may alternatively be a solid square 29' forming a square sub-pattern mark 24e as in FIG. 11, or spaced contacts or posts 29 forming a square sub-pattern mark 24f as in FIG. 12.

The target or artifacts described above and in the aforementioned figures may be created on the stage of the imaging system used in the lithographic process, and is preferably rotatable, for example, to the different positions shown in FIG. 5. In such case, wafer 21 as shown in FIGS. 1, 3 and 5 is instead stage 21, so that the artifact may be used for individual system calibration. The grid locations for the artifact or target correspond to the locations to be used to monitor and control the lithographic manufacturing process. Preferably, at least one mark, such as a chevron, provides an asymmetric pattern recognition feature. Using an otherwise conventional mask, the artifact or target of the present invention may be replicated on the mask for projection of the artifact image onto the wafer substrate, and lithographic formation thereon. In such case, wafer 21 as shown in FIGS. 1, 3 and 5 is instead mask 21, so that the artifact may be used for system matching, process monitoring and optimization.

In the target and method of aforementioned application Ser. No. 11/162,506, the different target patterns or mark groups 20a, 20b and so on are formed on different lithographic layers, so that overlay error between different fields on different lithographic levels may be determined. A preferred overlay embodiment of the present invention employs a single layer artifact with sub-pattern locations that correspond to locations of sub-patterns of an overlay target formed on different and multiple layers. This is shown in FIGS. 13 and 14, where the sub-patterns of overlay target in FIG. 13 marked "1," "2" and "3" have corresponding locations within the sub-patterns forming the artifact of FIG. 14 made in accordance with the present invention.

Figure 13:
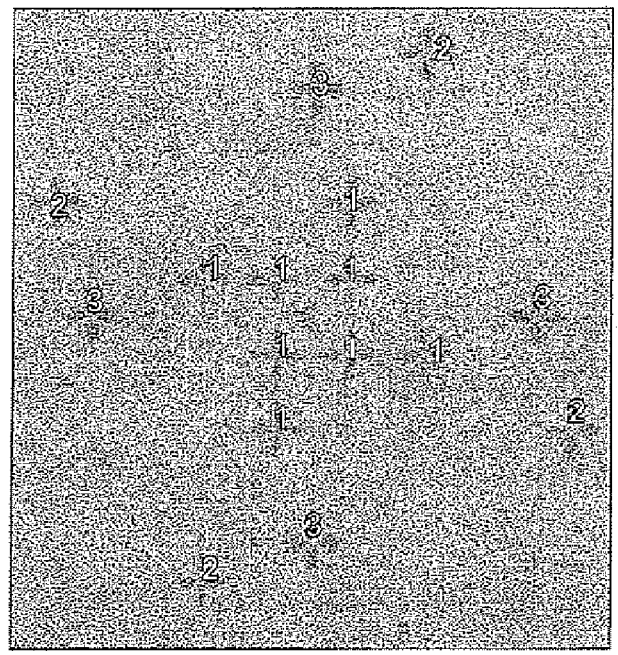
FIG. 13 is a top plan view of a multilayer overlay error target pattern formed in accordance with the U.S. application Ser. No. 11/162,506.
Figure 14:
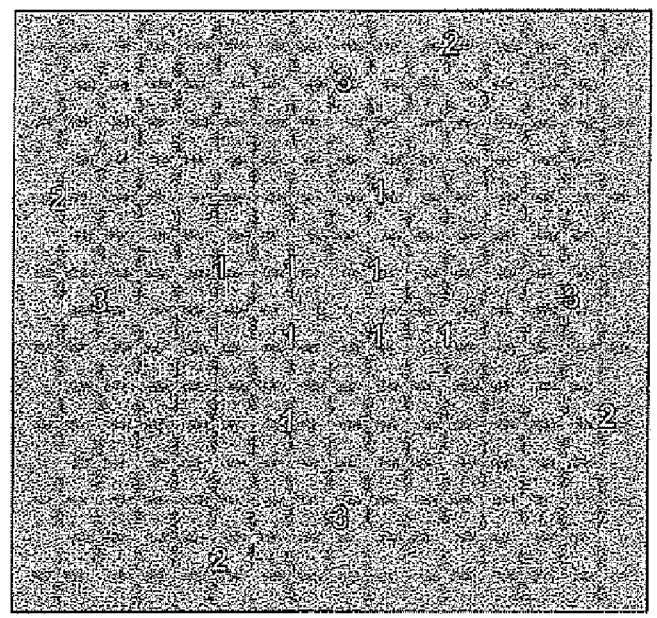
FIG. 14 is a top plan view of a single layer artifact of the present invention with sub-pattern locations that correspond to locations of sub-patterns of the overlay target of FIG. 13.

To determine and correct for the distortions introduced by an image-based overlay measurement tool in a lithographic process, one would first provide the locations of the individual sub-patterns or marks in an overlay target on the product to be lithographically produced, such as the sub-pattern locations in the type of overlay target shown in FIG. 13. One then creates a target pattern containing a regular array of symmetric sub-patterns of the type shown in FIG. 14 whose locations in the tool's field of view match those of the on-product overlay measurement marks. The relative position of the sub-pattern images is then measured, and the tool-induced sub-pattern position errors relative to a reference grid are then determined. One then applies corrections to overlay measurements that use the corresponding sub-pattern locations within the field of view to compensate for the fixed component of the tool-induced sub-pattern position errors.

In connection with the above, deconvolution of artifact and tool errors may be determined by artifact quadrant, for example, quadrant (−M,N), quadrant (N,M), quadrant (M,−N) and quadrant (−N,−M). Artifact error, $(\Delta X, \Delta Y)_A$, is an orientation-dependent component of the measured error, as shown below for measurement at two orientations, 0° and 180°, in the different quadrants:

$$Quad(-M, N) \begin{cases} \Delta X_A(-M, N) = \frac{1}{2}[\Delta X_0(-M, N) - \Delta X_{180}(M, -N)] \\ \Delta Y_A(-M, N) = \frac{1}{2}[\Delta Y_0(-M, N) - \Delta Y_{180}(M, -N)] \end{cases}$$

$$Quad(N, M) \begin{cases} \Delta X_A(N, M) = \frac{1}{2}[\Delta X_0(N, M) - \Delta X_{180}(-N, -M)] \\ \Delta Y_A(N, M) = \frac{1}{2}[\Delta Y_0(N, M) - \Delta Y_{180}(-N, -M)] \end{cases}$$

$$Quad(M, -N) \begin{cases} \Delta X_A(M, -N) = \frac{1}{2}[\Delta X_0(M, -N) - \Delta X_{180}(-M, N)] \\ \Delta Y_A(M, -N) = \frac{1}{2}[\Delta Y_0(M, -N) - \Delta Y_{180}(-M, N)] \end{cases}$$

$$Quad(-N, -M) \begin{cases} \Delta X_A(-N, -M) = \frac{1}{2}[\Delta X_0(-N, -M) - \Delta X_{180}(N, M)] \\ \Delta Y_A(-N, -M) = \frac{1}{2}[\Delta Y_0(-N, -M) - \Delta Y_{180}(N, M)] \end{cases}$$

Tool Error $(\Delta X, \Delta Y)_T$, is an orientation invariant component of the measured error, as shown below for measurement at 0° and 180° in the same four quadrants as above:

$\Delta X_T(-M,N) = \frac{1}{2}[\Delta X_0(-M,N) + \Delta X_{180}(M,-N)]$ $\Delta Y_T(-M,N) = \frac{1}{2}[\Delta Y_0(-M,N) + \Delta Y_{180}(M,-N)]$ $\Delta X_T(N,M) = \frac{1}{2}[\Delta X_0(N,M) + \Delta X_{180}(-N,-M)]$ $\Delta Y_T(N,M) = \frac{1}{2}[\Delta Y_0(N,M) + \Delta Y_{180}(-N,-M)]$ $\Delta X_T(M,-N) = \frac{1}{2}[\Delta X_0(M,-N) + \Delta X_{180}(-M,N)]$ $\Delta Y_T(M,-N) = \frac{1}{2}[\Delta Y_0(M,-N) + \Delta Y_{180}(-M,N)]$ $\Delta X_T(-N,-M) = \frac{1}{2}[\Delta X_0(-N,-M) + \Delta X_{180}(N,M)]$ $\Delta Y_T(-N,-M) = \frac{1}{2}[\Delta Y_0(-N,-M) + \Delta Y_{180}(N,M)]$ For measurement at four orientations, 0°, 90°, 180° and 270°, the deconvolution of artifact and tool errors is different from that described above. Artifact errors at four orientations, for the same quadrants as above, are determined as follows:

$$Quad(-M,N) \begin{cases} \Delta X_A(-M,N) = \frac{1}{4}[\Delta X_0(-M,N) - \Delta Y_{90}(N,M) - \\ \qquad \Delta X_{180}(M,-N) + \Delta Y_{270}(-N,-M)] \\ \Delta Y_A(-M,N) = \frac{1}{4}[\Delta Y_0(-M,N) + \Delta X_{90}(N,M) - \\ \qquad \Delta Y_{180}(M,-N) + \Delta X_{270}(-N,-M)] \end{cases}$$

$$Quad(N,M) \begin{cases} \Delta X_A(N,M) = \frac{1}{4}[\Delta X_0(N,M) - \Delta Y_{90}(M,-N) - \\ \qquad \Delta X_{180}(-N,-M) + \Delta Y_{270}(-M,N)] \\ \Delta Y_A(N,M) = \frac{1}{4}[\Delta Y_0(N,M) + \Delta X_{90}(M,-N) - \\ \qquad \Delta Y_{180}(-N,-M) - \Delta X_{270}(-M,N)] \end{cases}$$

$$Quad(M,-N) \begin{cases} \Delta X_A(M,-N) = \frac{1}{4}[\Delta X_0(M,-N) - \Delta Y_{90}(-N,-M) - \\ \qquad \Delta X_{180}(-M,N) + \Delta Y_{270}(N,M)] \\ \Delta Y_A(M,-N) = \frac{1}{4}[\Delta Y_0(M,-N) + \Delta X_{90}(-N,-M) - \\ \qquad \Delta Y_{180}(-M,N) - \Delta X_{270}(N,M)] \end{cases}$$

$$Quad(-N,-M) \begin{cases} \Delta X_A(-N,-M) = \frac{1}{4}[\Delta X_0(-N,-M) - \Delta Y_{90}(-M,-N) - \\ \qquad \Delta X_{180}(N,M) + \Delta Y_{270}(M,-N)] \\ \Delta Y_A(-N,-M) = \frac{1}{4}[\Delta Y_0(-N,-M) + \Delta X_{90}(-M,-N) - \\ \qquad \Delta Y_{180}(N,M) - \Delta X_{270}(M,-N)] \end{cases}$$

Figure 15:
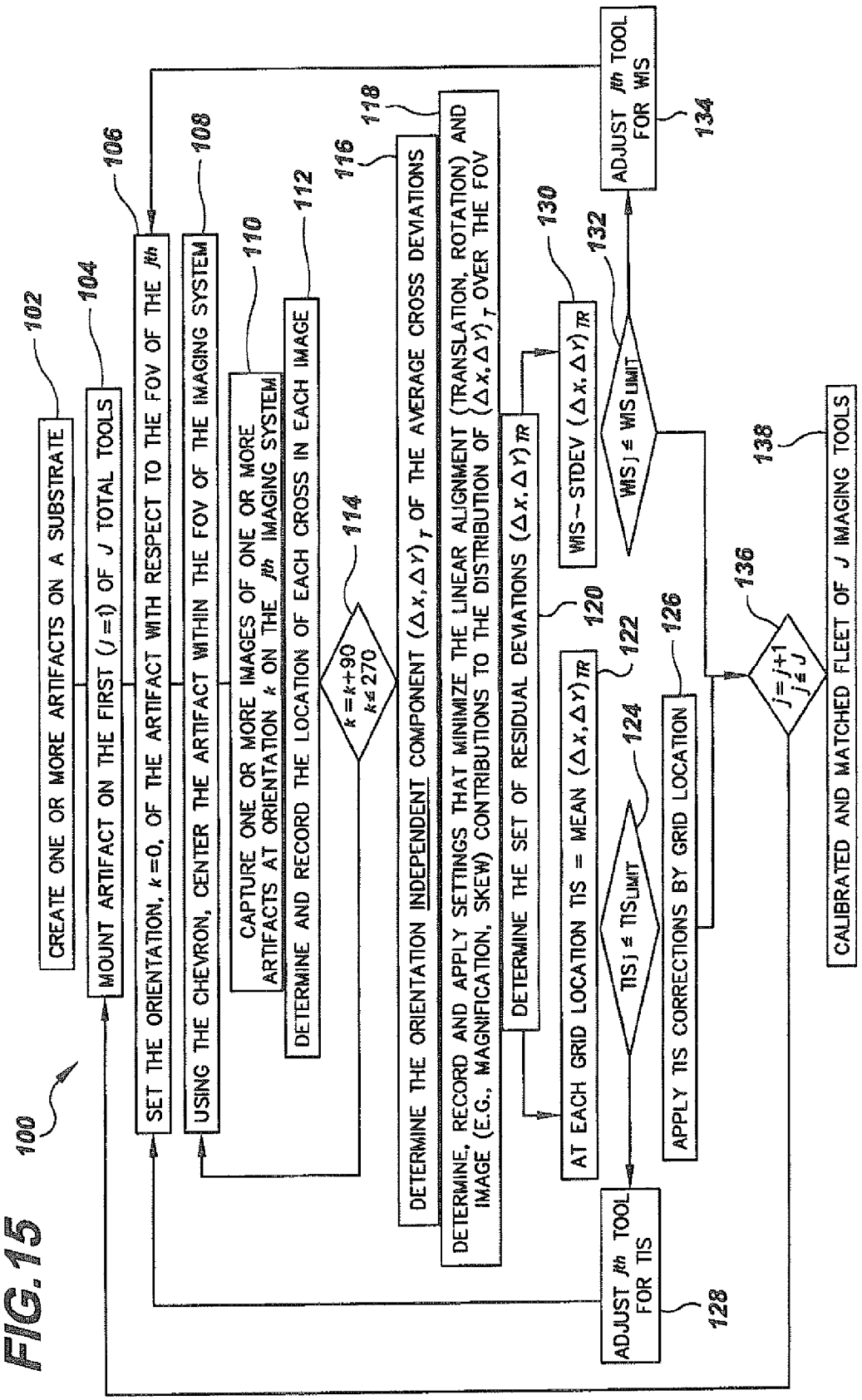
FIG. 15 is a flow chart showing the steps of the preferred method of calibrating and matching of image-based metrology systems for micro- and nano-scale device lithographic manufacturing in accordance with the present invention.

Tool errors at four orientations, for the same quadrants as above, are determined as follows:

$\Delta X_T(-M,N) = \frac{1}{4}[\Delta X_0(-M,N) + \Delta Y_{90}(N,M) + \Delta X_{180}(M,-N) + \Delta Y_{270}(-N,-M)]$ $\Delta Y_T(-M,N) = \frac{1}{4}[\Delta Y_0(-M,N) + \Delta X_{90}(N,M) + \Delta Y_{180}(M,-N) + \Delta X_{270}(-N,-M)]$ $\Delta X_T(N,M) = \frac{1}{4}[\Delta X_0(N,M) + \Delta Y_{90}(M,-N) + \Delta X_{180}(-N,-M) + \Delta Y_{270}(-M,N)]$ $\Delta Y_T(N,M) = \frac{1}{4}[\Delta Y_0(N,M) + \Delta X_{90}(M,-N) + \Delta Y_{180}(-N,-M) + \Delta X_{270}(-M,N)]$ $\Delta X_T(M,-N) = \frac{1}{4}[\Delta X_0(M,-N) + \Delta Y_{90}(-N,-M) + \Delta X_{180}(-M,N) + \Delta Y_{270}(N,M)]$ $\Delta Y_T(M,-N) = \frac{1}{4}[\Delta Y_0(M,-N) + \Delta X_{90}(-N,-M) + \Delta Y_{180}(-M,N) + \Delta X_{270}(N,M)]$ $\Delta X_T(-N,-M) = \frac{1}{4}[\Delta X_0(-N,-M) + \Delta Y_{90}(-M,N) + \Delta X_{180}(N,M) + \Delta Y_{270}(M,-N)]$ $\Delta Y_T(-N,-M) = \frac{1}{4}[\Delta Y_0(-N,-M) + \Delta X_{90}(-M,N) + \Delta Y_{180}(N,M) + \Delta X_{270}(M,-N)]$ The preferred method of calibrating and matching of image-based metrology systems for micro- and nano-scale device lithographic manufacturing in accordance with the present invention is depicted in FIG. 15. The method 100 initially includes creating one or more artifacts on a substrate 102, by standard lithographic techniques and in accordance with the aforementioned discussion. The artifact is then mounted on the first tool 104 and the first orientation of the artifact is set with respect to the field of view (FOV) of the first tool 106. Next, one determines the center of each mark or sub-pattern in the FOV of the image 108, captures the image at the orientation on the tool imaging system 110, determines and records the location of each cross or other sub-pattern mark in the image 112, and determines the x-y deviations of each mark from the Cartesian grid. The steps 108-112 are then repeated 114 for each additional orientation, to obtain two or more of 0°, 90°, 180°, or 270° orientations with respect to the axes of the FOV on one or more imaging systems. For a non-square FOV, only 0° and 180° measurements are possible for some FOV locations. The orientation invariant components $(\Delta X, \Delta Y)_T$ of the average mark or sub-pattern deviation is then determined 116, as discussed above.

The method then models linear alignment deviations (i.e., translation, rotation) and image deviations (e.g., isotropic magnification, anisotropic magnification, skew) to the distribution of $(\Delta X, \Delta Y)_T$ over the FOV, and then applies and records the FOV adjustments of these parameters available on the imaging system to minimize the deviations, 118. The modeling of the correctible components is a conventional least-squares fit of the tool errors $(\Delta X, \Delta Y)_T$ to the known design grid of the mark locations. One then determines the post-adjustment or residual deviations $(\Delta X, \Delta Y)_{TR}$ 120, and at each grid location within the FOV. This includes determining the mean tool induced shift TISM at each grid location 122, by the equation TISM=Mean $(\Delta X, \Delta Y)_{TR}$, as discussed above. The TISM is compared to a predetermined TISM limit 124. If the TISM is determined to be less than or equal to the TISM limit, the TISM correction is applied by grid location 126. If the TISM is greater than the TIS limit, the tool is adjusted for TISM 128, and steps 106-124 are repeated. The TIS variability is also determined at each grid location 130 by the equation, TISV=Stdev$(\Delta X, \Delta Y)_{TR}$, again by the method discussed above. If TISV is determined to be greater than a predetermined TISV limit 132, the tool is adjusted 134, and steps 106-134 are then repeated. Once the TISM and TISV are within their respective limits for the tool being measured and calibrated, steps 104-134 are repeated for each additional tool. After completing the steps for all of the desired imaging tools, the fleet of tools is than calibrated and matched with each other 138.

As a refinement of the method, the positions of the sub-patterns within the grid may be measured or determined independently. One method of measuring the true positions of the sub-patterns would be to use a reticle measurement tool to measure their locations on the mask. It is also possible to deduce their true location by averaging together the grid-fit results from a suitably large data set with enough variation in lithography tools and measurement tools used that their net contribution becomes much smaller in the average than the true systematic grid position error for each sub-pattern. However they are determined, the refined sub-pattern positions can advantageously be used in place of an assumed perfectly regular grid layout when performing the linear regression fit to the measured sub-pattern positions described in the previous paragraph.

In summary, the method 100 to calibrate and match image-based metrology systems aligns to and captures one or more images of the artifact on a substrate at two or more of 0°, 90°, 180°, or 270° orientations with respect to the axes of the FOV on one or more imaging systems. The method then models linear deviations over the FOV, e.g., translation, rotation, isotropic magnification, anisotropic magnification, skew, and then applies and records the FOV adjustments available on the imaging system, e.g., translation, rotation, magnification, to minimize the linear deviations. One then determines the post-adjustment (residual) deviations at the within-FOV grid locations, records the system-specific set of grid deviations, and applies corrections to the grid locations in subsequent images captured by the system.

Preferably, the post-adjustment (residual) deviations are interpolated among neighboring grid locations to determine the deviations from a finer pitch grid. Also, the artifact may be translated with respect to the FOV by an integer fraction of the pitch, with images captured at each artifact position, and the aforementioned steps repeated using the set of translated images to achieve measurements on a finer pitch grid (also referred to as pitch-splitting).

As indicated by the term "under one or more imaging conditions" in method step 110, artifact images may be collected and analyzed through the entire set of conditions (focus, illumination, wavelength, magnification, etc.) available on a particular imaging tool. Applying the methods described to this comprehensive set of images then ensures calibration and matching over all possible operating conditions of the imaging system(s).

Figure 16:
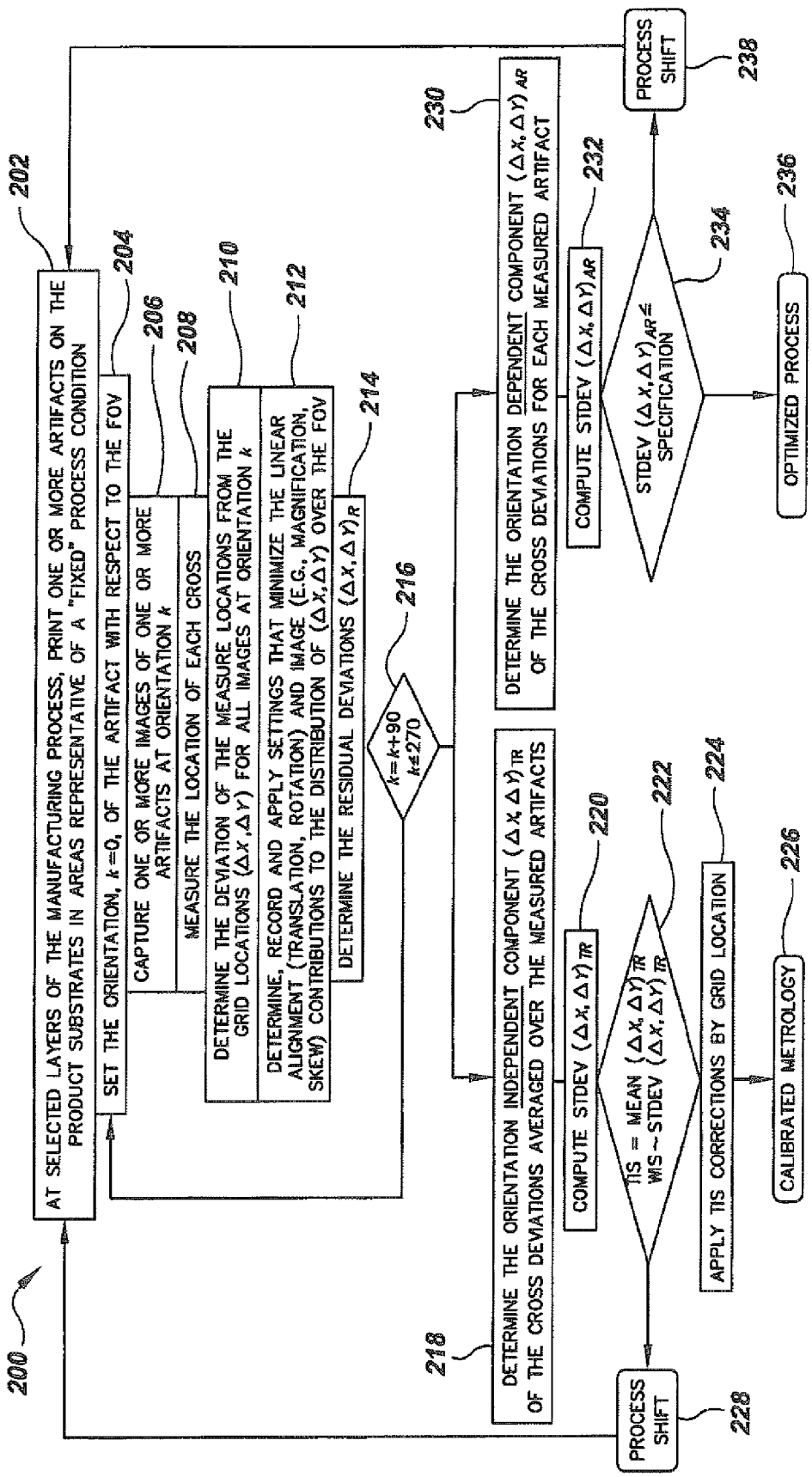
FIG. 16 is a flow chart showing the steps of the preferred method simultaneously to calibrate and match image-based metrology systems and to monitor and optimize a micro- and nano-scale device lithographic manufacturing process with such systems.

The present invention also provides a method simultaneously to calibrate and match image-based metrology systems and to monitor and optimize a micro- and nano-scale device lithographic manufacturing process with such systems. This method 200 is depicted in FIG. 16, and includes initially adding artifact designs at one or more locations on one or more masks used in the manufacturing process, and then printing the artifact images simultaneously with the device images on product substrates. The artifacts should be printed on the product in areas representative of the manufacturing process 202. The first orientation of the artifact is set with respect to the FOV 204. Following such alignment, one or more images of the one or more artifacts at the selected orientation is captured 206, and the location of each cross mark or sub-pattern is measured 208. For all of the images at the selected orientation, the deviation of the measured location with respect to the ideal location from the grid locations, to determine $(\Delta X, \Delta Y)$ 210. The method then includes determining, recording and applying settings that minimize the contributions of the linear alignment (i.e., translation and rotation) and the contributions of the image (e.g., magnification and skew) to the distribution of $(\Delta X, \Delta Y)$ over the FOV 212. The modeling of the correctible components is a conventional least-squares fit of the deviations $(\Delta X, \Delta Y)$ to the known design grid of the mark locations. The residual deviations $(\Delta X, \Delta Y)_R$ are the determined 214. The steps 204-214 are then repeated 216 for each additional orientation, to obtain two or more of 0°, 90°, 180°, or 270° orientations with respect to the axes of the FOV on one or more imaging systems. For a non-square FOV, only 0° and 180° measurements are possible for some FOV locations.

To calibrate the metrology system used in the lithographic process, the orientation independent or invariant component $(\Delta X, \Delta Y)_{TR}$ of the mark or sub-pattern deviations averaged over the measured artifacts is then determined 218. The Stdev $(\Delta X, \Delta Y)_{TR}$, is computed 220, and then the TISM (=Mean $(\Delta X, \Delta Y)_{TR}$) and TISV (=Stdev$(\Delta X, \Delta Y)_{TR}$) are computed 222, again by the methods discussed above. If either of the TISM or TISV is outside of limits, a process shift or adjustment is made to reduce the deviation 228, and steps 200-222 are repeated. Once TISM and TISV is determined to be within the desired limits, the TIS corrections are applied by grid location 224, and the metrology system is considered calibrated 226.

To optimize the lithographic process at the same time, the orientation dependent component $(\Delta X, \Delta Y)_{AR}$ of the mark or sub-pattern deviations is then determined for each measured artifact 230. The Stdev$(\Delta X, \Delta Y)_{AR}$, is computed 232, again by the method discussed above, and then the Stdev$(\Delta X, \Delta Y)_{AR}$ is compared to the specification 234. If the Stdev$(\Delta X, \Delta Y)_{AR}$ is greater than the specification, a process shift or adjustment is made to reduce the deviation 238, and steps 200-216 and 230-234 are repeated. Once the Stdev$(\Delta X, \Delta Y)_{AR}$ is less than or equal to than the specification, the process is considered optimized 236.

In summary, the method to calibrate and match image-based metrology systems and simultaneously to monitor and optimize a lithographic manufacturing process aligns to and captures one or more images of the artifact on the product substrate at two or more of 0°, 90°, 180° and/or 270° orientations with respect to the axes of the FOV on one or more imaging systems. The method then includes determining the center of each mark in the image, determining the x-y deviations of each mark from the Cartesian grid, and then modeling and removing linear components of across-FOV variation, e.g., translation, rotation, isotropic magnification, anisotropic magnification, or skew. The orientation dependent and independent components of the residuals are then determined at the grid locations, and the process-specific set of grid deviations are stored. The method then includes applying corrections to the grid locations in subsequent images captured by the system.

Preferably, the post-adjustment (residual) deviations are interpolated among neighboring grid locations to determine the deviations from a finer pitch grid. Also, the artifact may be translated with respect to the FOV by an integer fraction of the pitch, with images captured at each artifact position, and the aforementioned steps repeated using the set of translated images to achieve measurements on a finer pitch grid (also referred to as pitch-splitting).

As indicated by the term "under one or more imaging conditions" in method step 206, artifact images may be collected and analyzed through the entire set of conditions (focus, illumination, wavelength, magnification, etc.) available on a particular imaging tool. Applying the methods described to this comprehensive set of images then ensures calibration and matching over all possible operating conditions of the imaging system(s).

For metrology optimization and matching, artifact measurement is preferably performed using standard symmetry-based overlay algorithms to find the centers of each sub-pattern or each sub-group. In the case of the target illustrated in FIGS. 1, 3 and 5, the center of each sub-pattern cross is found. In the case of a sub-group, the center is found of a rotationally symmetric set of crosses, with the axis of symmetry at the centre of the target pattern.

A linear fit of the measured locations can be performed to determine the bulk position (rotation and translation) of the target, to very high precision; it can also determine the overall system magnification and linear distortions (skew) due to either camera or optical system.

Identification of higher-order components of distortion is then possible. Different focal planes of the overlay tool can be sampled by moving the tool objective with respect to the artifact; such a 3 dimensional map of distortions can then be used to reduce the observed tool-induced-shift of a tool, and to improve matching between overlay tools. Since the artifact is symmetric to 90° rotations, measurement can be performed at different target orientations to distinguish intrinsic target distortions from tool-induced distortions. The artifact can also be printed on and measured through various film stacks to establish the TIS contributions specific to the manufacturing processes.

The method and system of the present invention have a number of benefits and advantages. In artifact design and fabrication, information is distributed uniformly across the FOV in both axes. A high degree of redundancy is contained in the information—in the current embodiment a total of 112 separate point distortions, in each axis, can be measured from a single captured image. The artifact can be produced by standard lithography techniques, and is compact—approximately 50 microns square in an embodiment appropriate for optical tools, approximately 5 microns square in an embodiment appropriate for SEM tools. This enables it to be deployed either in the scribe lines of production wafers, in unused regions of the chip or mounted on the stage of the imaging tool itself. Many artifacts can be printed and measured cheaply.

The present method of automated calibration and matching of a fleet imaging tools has additional benefits, including deconvolution of tool errors and actual errors, separate monitoring and control of TISM and TISV effects, and TIS correction by artifact grid location. The method also enables interpolation to between-grid locations. For overlay calibration, measurements of distortion are made using the same methods as actual overlay measurements, and so provide a direct measure of the effect of distortion on overlay performance.

The present method of in-situ monitoring and control of metrology tools and the manufacturing process has further benefits: measurement on product substrates, separate monitoring and control of tool errors and process errors during manufacturing, and guarantee of tool and process specifications.

The present invention further provides large numbers of calibration targets of small size that may be printed in the scribe or kerf areas of semiconductor wafers and that may be measured at low cost.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining and correcting for distortions introduced by an imaging tool comprising:
   providing an imaging tool having a field of view (FOV);
   creating a target pattern containing a regular array of symmetric sub-patterns having locations spanning the FOV;
   using the imaging tool, measuring relative position of the sub-pattern images at one or more target orientations;
   determining tool-induced sub-pattern position deviations from designed locations of the sub-patterns; and
   applying corrections to compensate for an orientation independent component of the sub-pattern position deviations.

2. The method of claim 1 wherein the target pattern contains at least two different patterns, a first target pattern having a center at the origin of an orthogonal grid of pitch p, with the sub-patterns of the first target pattern have coordinates of:

$$(-M,N)p, (N,M)p, (M,-N)p \text{ and } (-N,-M)p,$$

where N and M are integers, and the distance r of each first target sub-pattern from the center of the first target pattern is defined by the equation:

$$r = p\sqrt{(N^2+M^2)},$$

and wherein a second target pattern has a center at the same location as the first target pattern, with the sub-patterns of a second target pattern have coordinates of:

$$(-M+m,N+n)p, (N+n,M+m)p, (M+m,-N+n)p \text{ and } (-N+n,-M+m)p,$$

where n and m are integers, and $$|n|+|m|=2i,$$

where i is an integer.

3. The method of claim 1 wherein the target pattern is mounted on a stage of the measurement tool.

4. The method of claim 1 wherein the target pattern is created on a mask used in the lithographic process.

5. The method of claim 1 wherein the target pattern is created on a wafer being measured by the measuring tool.

6. The method of claim 1 wherein the on-product overlay measurement marks are intended to be created on more than one lithographic layer, and wherein the target pattern is created on a single lithographic layer.

7. A method of determining and correcting for distortions introduced by an image-based overlay measurement tool in a lithographic process comprising:
   providing an image-based overlay measurement tool having a field of view (FOV);
   determining locations of overlay measurement marks on a product to be measured by the measurement tool;
   creating a target pattern containing a regular array of symmetric sub-patterns whose locations in the FOV match those of the on-product overlay measurement marks;
   using the measurement tool, measuring relative position of the sub-pattern images;
   determining tool-induced sub-pattern position deviations from designed locations of the sub-patterns; and
   applying corrections to overlay measurements that use corresponding sub-pattern locations within the FOV to compensate for an orientation independent component of the tool-induced sub-pattern position deviations.

8. A method of determining and correcting for distortions introduced by an image-based overlay measurement tool in a lithographic process comprising:
   providing an image-based overlay measurement tool having a field of view (FOV);
   determining locations of overlay measurement marks on a product to be measured by the measurement tool;
   creating a target pattern containing a regular array of symmetric sub-patterns whose locations in the field of view match those of the on-product overlay measurement marks;
   determining positions of the sub-patterns by an external measurement tool or technique;
   using the measurement tool, measuring relative position of the sub-pattern images;

determining tool-induced sub-pattern position errors relative to the externally determined positions; and applying corrections to overlay measurements that use the corresponding sub-pattern locations within the FOV to compensate for an orientation independent component of the tool-induced sub-pattern position errors.

9. A method of determining and correcting for the distortions introduced by an image-based measurement tool and a nano-scale lithographic manufacturing process comprising:

creating a reference grid containing positions of a regular array of symmetric sub-patterns for an ideal target;

lithographically forming a product target on a substrate, the product target having a regular array of symmetric sub-patterns corresponding to the positions of the regular array of symmetric sub-patterns on the reference grid;

capturing images of the regular array of symmetric sub-patterns of the product target on the wafer;

measuring deviation of positions of the product target sub-pattern images relative to the corresponding sub-patterns on the reference grid, at one or more target orientations;

separately determining orientation dependent and independent components of the measured deviations from the corresponding sub-patterns on the reference grid;

applying corrections to measurements at corresponding on-grid and off-grid sub-pattern image locations to compensate for tool-induced sub-pattern placement errors; and monitoring and controlling the distribution of process-induced sub-pattern placement errors over the wafer.

10. The method of claim 9 including measuring deviation of positions of the product target sub-pattern images relative to the corresponding sub-patterns on the reference grid, at multiple target orientations, and separately determining the orientation dependent and independent components of the measured deviations from the corresponding sub-patterns on the reference grid based on the measured deviations at the multiple target orientations.

11. A method of calibrating and matching image-based metrology systems used for micro- and nano-scale lithographic manufacturing processes comprising:

creating a reference grid containing positions of a regular array of symmetric sub-patterns for an ideal target;

lithographically forming a calibration target on a substrate at two or more orientations with respect to field of view of an image-based metrology system, the calibration target having a regular array of symmetric sub-patterns corresponding to the positions of the regular array of symmetric sub-patterns on the reference grid;

using the image-based metrology system, capturing images of the regular array of symmetric sub-patterns of the calibration target on the wafer for at least two orientations of the calibration target;

determining centers of the sub-pattern images of the calibration target;

measuring deviation of positions of the calibration target sub-pattern images relative to the corresponding sub-patterns on the reference grid, for at least two orientations of the calibration target;

determining orientation independent components of the measured deviations from the corresponding sub-patterns on the reference grid;

applying adjustments available on the metrology system to minimize linear alignment and image contributions to the orientation independent components of the measured deviations;

after applying the adjustments, determining any residual deviations of the calibration target sub-pattern images from the corresponding sub-patterns on the reference grid; and applying corrections to grid locations of subsequent images captured by the metrology system.

12. The method of claim 11 wherein the calibration target pattern contains at least two different patterns, a first target pattern having a center at the origin of an orthogonal grid of pitch p, with the sub-patterns of the first target pattern have coordinates of:

$$(-M,N)p, (N,M)p, (M,-N)p \text{ and } (-N,-M)p,$$

where N and M are integers, and the distance r of each first target sub-pattern from the center of the first target pattern is defined by the equation:

$$r = p\sqrt{(N^2 + M^2)},$$

and wherein a second target pattern has a center at the same location as the first target pattern, with the sub-patterns of a second target pattern have coordinates of:

$$(-M+m, N+n)p, (N+n, M+m)p, (M+m, -N+n)p \text{ and } (-N+n, -M+m)p,$$

where n and m are integers, and $$|n| + |m| = 2i,$$

where i is an integer.

13. The method of claim 11 wherein the target is formed on a wafer to be manufactured by the lithographic manufacturing process.

14. The method of claim 11 wherein the target is formed on a stage of the image-based measurement tool.

15. The method of claim 11 further including, after applying the corrections, interpolating further deviation of positions of the calibration target sub-pattern images, relative to a pitch grid finer than the reference grid, among neighboring grid locations to determine deviations from the finer pitch grid.

16. The method of claim 12 further including translating captured images of the calibration target sub-pattern images by an integer fraction of the pitch to achieve measurements on a relative to a pitch grid finer than the reference grid, and repeating the steps of measuring deviation of positions of the calibration target sub-pattern images and determining orientation dependent and independent components of the measured deviations, prior to applying the corrections to the measurements at corresponding on-grid and off-grid locations.

17. A method of simultaneously calibrating and matching image-based metrology systems and monitoring and optimizing micro- and nano-scale lithographic manufacturing processes comprising:

creating a reference grid containing positions of a regular array of symmetric sub-patterns for an ideal target;

lithographically forming a calibration target on a mask to be used in a lithographic manufacturing process, at two or more orientations with respect to field of view of an image-based metrology system, the calibration target having a regular array of symmetric sub-patterns corresponding to the positions of the regular array of symmetric sub-patterns on the reference grid;

using the lithographic manufacturing process mask, printing the calibration target at the two or more orientations along with an image of a functional device on a wafer substrate;

using an image-based metrology system, capturing images of the regular array of symmetric sub-patterns of the calibration target on the wafer for at least two orientations of the calibration target;

determining centers of the sub-pattern images of the calibration target;

measuring deviation of positions of the calibration target sub-pattern images relative to the corresponding sub-patterns on the reference grid, for at least two orientations of the calibration target;

determining orientation dependent and independent components of the measured deviations from the corresponding sub-patterns on the reference grid;

storing the orientation dependent and independent components of the measured deviations; and applying corrections to grid locations of subsequent images captured by the metrology system.

18. The method of claim 17 wherein the calibration target pattern contains at least two different patterns, a first target pattern having a center at the origin of an orthogonal grid of pitch p, with the sub-patterns of the first target pattern have coordinates of:

(−M,N)p, (N,M)p, (M,−N)p and (−N,−M)p, where N and M are integers, and the distance r of each first target sub-pattern from the center of the first target pattern is defined by the equation:

$r = p\sqrt{(N^2+M^2)}$, and wherein a second target pattern has a center at the same location as the first target pattern, with the sub-patterns of a second target pattern have coordinates of:

(−M+m,N+n)p, (N+n,M+m)p, (M+m,−N+n)p and (−N+n,−M+m)p, where n and m are integers, and $|n|+|m|=2i$, where i is an integer.

19. The method of claim 17 further including, after applying the corrections, interpolating further deviation of positions of the calibration target sub-pattern images, relative to a pitch grid finer than the reference grid, among neighboring grid locations to determine deviations from the finer pitch grid.

20. The method of claim 18 further including translating captured images of the calibration target sub-pattern images by an integer fraction of the pitch to achieve measurements on a relative to a pitch grid finer than the reference grid, and repeating the steps of measuring deviation of positions of the calibration target sub-pattern images and determining orientation dependent and independent components of the measured deviations, prior to applying the corrections to the measurements at corresponding on-grid and off-grid locations.

* * * * *